United States Patent

Harris et al.

[15] 3,643,278

[45] Feb. 22, 1972

[54] PRINTED CIRCUIT PANEL SCRUBBING APPARATUS

[72] Inventors: Daniel M. Harris, Canoga Park; Jack E. Moore, Woodland Hills; Chester E. Taylor, Reseda; Walter H. Walczyk, Oxnard, all of Calif.

[73] Assignee: The Bunker-Ramo Corporation, Oak Brook, Ill.

[22] Filed: Apr. 13, 1970

[21] Appl. No.: 29,366

[52] U.S. Cl. ....................................... 15/77, 15/21 D, 51/23

[51] Int. Cl. ....................................... A46b 13/02

[58] Field of Search ....................... 15/21 D, 77, 88, 100, 102; 51/23, 80 A; 118/72

[56] References Cited

UNITED STATES PATENTS

| | | | |
|---|---|---|---|
| 1,617,469 | 2/1927 | Weber | 15/77 |
| 3,093,852 | 6/1963 | Madge | 15/77 |
| 2,497,423 | 2/1950 | Spanier et al. | 15/77 |
| 1,510,465 | 10/1924 | Dittman | 118/72 |
| 1,958,001 | 5/1934 | Heim | 51/80 A |
| 2,901,868 | 9/1959 | Price et al. | 51/80 A |

*Primary Examiner*—Edward L. Roberts
*Attorney*—Frederick M. Arbuckle

[57] ABSTRACT

A scrubbing apparatus particularly useful for scrubbing clean the plating on the base contact fingers of printed circuit panels. The apparatus is comprised of a pair of cylindrical brushes each mounted for rotation in the same horizontal plane about spaced vertically oriented axes. The brush peripheries are closely spaced from one another to permit the passage of a circuit panel therebetween along a guide and support track. Means are provided to adjustably position the brushes to permit simultaneous scrubbing of either both sides of a single panel or one side each of a pair of panels. Adjustability also enables the brush wear to be compensated for. A source of waterflow is provided to continually wet the brush periphery.

8 Claims, 5 Drawing Figures

INVENTORS
DANIEL M. HARRIS
JACK E. MOORE
CHESTER E. TAYLOR
WALTER H. WALCZYK
BY
Lindenberg, Freilich & Wasserman
ATTORNEYS INVENTORS
DANIEL M. HARRIS
JACK E. MOORE
CHESTER E. TAYLOR
WALTER H. WALCZYK
BY
Lindenberg, Freilich & Wasserman
ATTORNEYS

PRINTED CIRCUIT PANEL SCRUBBING APPARATUS

FIELD OF THE INVENTION

This invention relates generally to a scrubbing apparatus particularly useful in the manufacture of printed circuit panels for scrubbing clean the base contact fingers or tabs thereof prior to plating.

DESCRIPTION OF THE PRIOR ART

In various phases of the manufacture of printed circuit panels, it is essential to clean areas of the panel, as by brush scrubbing. For example, it is very important to completely remove any oxidation, fingerprint dirt, etc., from the tin-lead plating on the base contact fingers of the panel prior to chemically stripping the tin-lead plating. In order to insure good adhesion of subsequent metal electroplating, the now exposed copper surface must be ultraclean and smooth. In the recognition of this requirement, it has been common practice to manually scrub such tab areas with a wet cleaning pad, (e.g., Scotchbrite (3M) ultrafine, type S pad). This manual procedure is of course quite time consuming and costly.

SUMMARY OF THE INVENTION

The present invention is directed to an apparatus particularly useful in the manufacture of printed circuit panels for facilitating the scrubbing of tab contact areas.

Briefly, in accordance with the present invention, a scrubbing apparatus is provided comprised of a pair of horizontally oriented cylindrical brushes respectively mounted for rotation about spaced vertically oriented axes. The brush peripheral surfaces are closely spaced from one another to permit the passage of a circuit panel therebetween along a guide and support means.

In one embodiment of the invention, the guide and support means comprises a channel having a dimension approximating the thickness of a single printed circuit panel for enabling an operator to insert the panel and move it back and forth within the channel as the brushes simultaneously scrub both sides thereof. Alternatively, the channel can accept a spacer adapted to fit between and provide support to a pair of spaced circuit panels to enable the brushes to simultaneously scrub the outside surfaces of both panels.

In a further embodiment of the invention, the guide and support means incorporates a conveyor system for transporting a succession of panels between the brushes.

In accordance with a significant feature of the invention, means are provided for adjusting the position of the brushes to compensate for brush wear and to enable the apparatus to accommodate either one or two panels at a time. In one embodiment of the invention, the brushes can be manually positioned and locked into place. In an alternative embodiment, the brushes are spring urged toward the printed circuit panel.

In accordance with a further aspect of the invention, a source of liquid is provided to continually wet the periphery of the brushes to facilitate the cleaning action and minimize the possibility of damaging the printed circuit panel contact areas.

In accordance with a further feature of the preferred embodiment of the invention, air motors are utilized to drive the brushes via drive belt means.

Figures 1, 2:
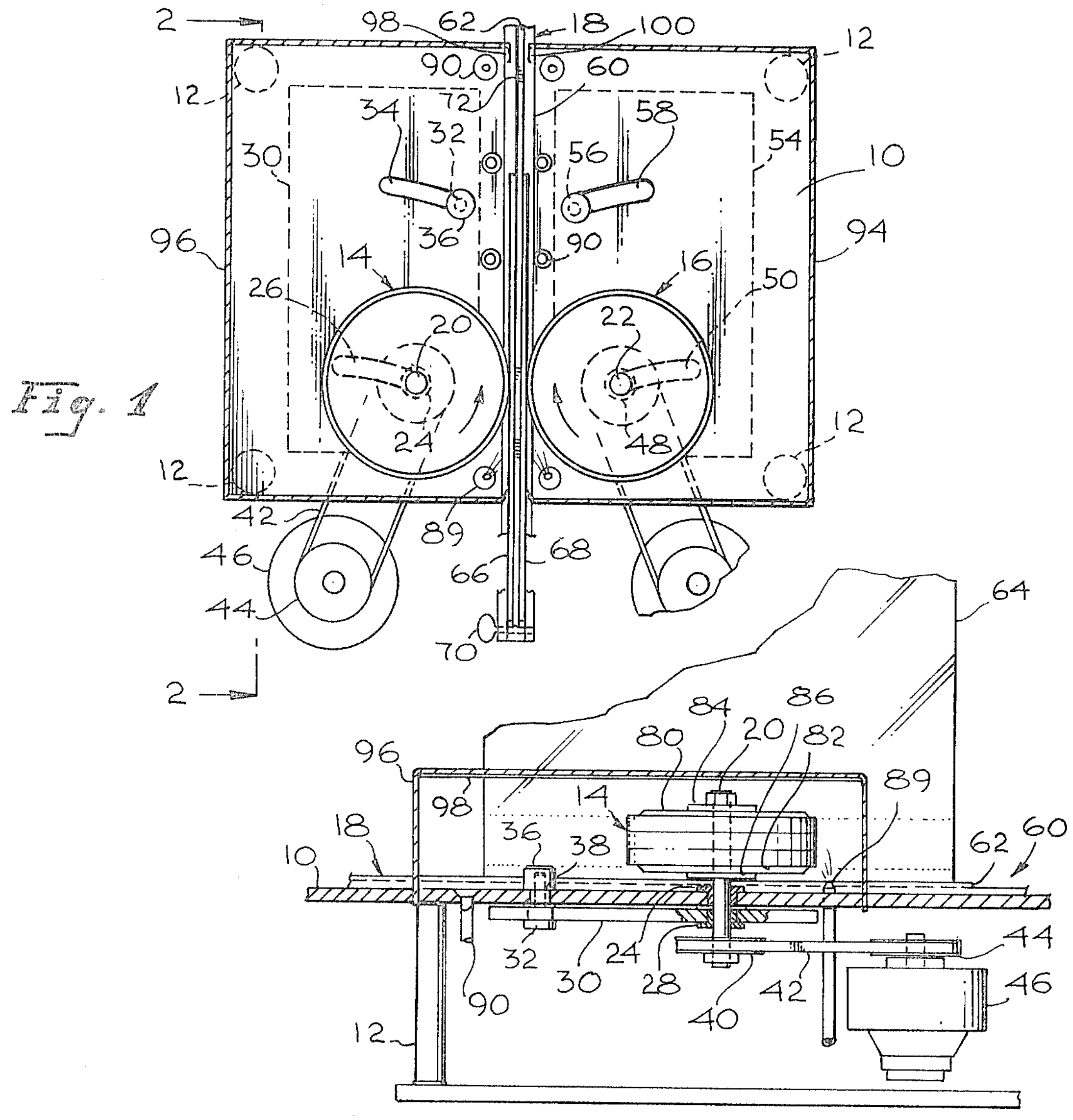
FIG. 1 is a plan view of a scrubbing apparatus in accordance with the present invention.
FIG. 2 is a sectional view taken substantially along the plane 2—2 of FIG. 1.

Attention is now called to FIGS. 1 and 2 of the drawings which illustrate a preferred embodiment of the scrubbing apparatus in accordance with the present invention. The scrubbing apparatus is comprised of a flat baseplate 10 mounted on a set of depending legs 12. A pair of cylindrical scrubbing brushes 14 and 16 are mounted so as to rotate in opposite directions above the baseplate 10 in order to scrub areas of a printed circuit panel moved along a guide and support means 18 extending between the brushes 14 and 16. In order to enable the scrubbing apparatus to be utilized to simultaneously scrub either one or two printed circuit panels and in addition to compensate for brush wear, the position of the brushes 14 and 16 relative to the guide and support means 18 is made adjustable.

More particularly, in accordance with the preferred embodiment of the invention, the brushes 14 and 16 are respectively secured to spindles 20 and 22. The spindle 20 is journaled for rotation in a bearing sleeve 24 which is movable along an arcuate slot 26 defined in the baseplate 10. The spindle 20 is also journaled for rotation in a bearing 28 fixed within a movable plate 30 supported for movement beneath and parallel to the baseplate 10. A post 32 is also fixed to the movable plate 30 and extends through an arcuate slot 34 formed in the base plate 10 essentially parallel to or an equidistance from the arcuate slot 26. The post 32 is fixed on one end to the movable plate 30 and on its other end is terminally threaded to receive a knob clamp 36. The knob clamp 36 can be loosened to enable an operator to move the post 32 in the arcuate slot 34, to thus in turn move the plate 30 to move the spindle 20 along the slot 26. In order to lock the brush 14 at a desired position, the knob clamp 36 is tightened down on the reduced threaded end of post 32 to thus clamp the baseplate 10 between the lower serated surface of the knob 36 and the shoulder 38 on post 32.

A pulley 40 is secured to the end of the spindle 20 beneath the movable plate 30. A drive belt 42 couples a drive pulley 44 to the pulley 40. The drive pulley 44 is driven by an air motor 46. Thus, as the motor 46 is driven, the drive pulley 44 is rotated to in turn drive the pulley 40 via the belt 42 to thus turn the spindle 20 and the brush 14.

A brush 16 is mounted for rotation in essentially the same manner as the brush 14. However, whereas the brush 14 is mounted to rotate in one direction, for example counterclockwise as illustrated in FIG. 1, the brush 16 is mounted to rotate in the opposite direction. In other respects the mounting of brush 16 corresponds to the mounting of brush 14. That is, the brush 16 is mounted on spindle 22 which is journaled for rotation in bearing 48 slidable in arcuate slot 50. The spindle 22 is also journaled for rotation in a bearing (not shown) fixed in a movable plate 54 mounted for movement parallel to and beneath baseplate 10. A post 56 identical in construction to post 32 is secured to the movable plate 54. The post 56 is slidable in arcuate slot 58 defined in the baseplate 10.

The guide and support means 18 preferably constitutes a channel member 60 secured to the baseplate 10. The channel member 60 defines a channel 62 having a dimension very slightly larger than the thickness of a printed circuit panel. In the utilization of the apparatus of FIGS. 1 and 2 to simultaneously scrub the tab areas on both sides of a single panel 64 (shown in FIG. 2), the brushes 14 and 16 are adjusted so that their peripheries contact both faces of the panel 64 when it is placed in the channel 62. In use, the operator will reciprocally move the panel 64 along the channel 62 as the brushes 14 and 16 rotate simultaneously scrub both faces of the panel 64.

It is pointed out, as shown in FIG. 1, that the scrubbing apparatus of FIGS. 1 and 2 can alternatively be utilized to simultaneously scrub single surfaces on two separate printed circuit panels. In order to do this, the printed circuit panels 66 and 68 are clamped together in spaced relationship by a clamp 70. A spacer 72 having a thickness dimension substantially equal to the spacing between the clamped printed circuit panels is fitted in the channel 62. The position of brushes 14 and 16 is adjusted so as to cause their peripheries to contact the outer surfaces of the clamped printed circuit panels 66 and 68. The operator then reciprocally moves the clamped printed circuit panels along the channel member 60 as the brushes scrub the outer faces of the printed circuit panels.

As shown in FIGS. 1 and 2, the brushes 14 and 16 are substantially cylinderically shaped and are preferably formed by stacking a plurality of abrasive pads such as commercially available Scotchbrite disks. The plurality of disks are placed on the spindles as shown in FIG. 2 and compressed between flat compression washers 80 and 82. The washers 80 and 82 are secured between metal washers 84 and 86 which are in turn clamped together by retainer nuts threaded on the respective spindles.

In order to minimize the likelihood of panel damage and to assure proper scrubbing, the brushes are continually wetted by a liquid (e.g., water or a water-detergent solution) supplied thereto from the water inlet 89 projecting above the base plate 10. Several through-holes 90 are provided in the baseplate 10 to permit water drainage. As is further shown in FIGS. 1 and 2, in order to minimize splashing, cover portions 94 and 96 are hinged to the baseplate 10 and extend thereover. The cover portions 94 and 96 are respectively provided with opposed flexible splash lips 98 and 100 (see FIG. 3) which are spaced from one another above the support and guide means 18 to enable the printed circuit panels to be moved back and forth along the channel while the portions of the cover 94 and 96 are closed.

Figure 3:
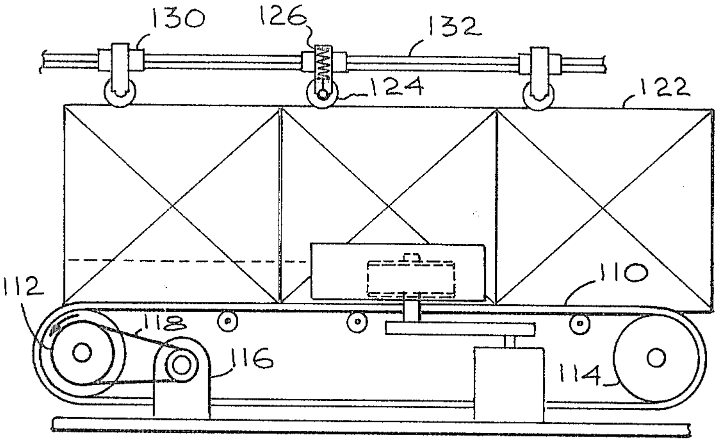
FIG. 3 is a side view of a scrubbing system in accordance with the invention incorporating a printed circuit panel conveyor means.
Figure 4:
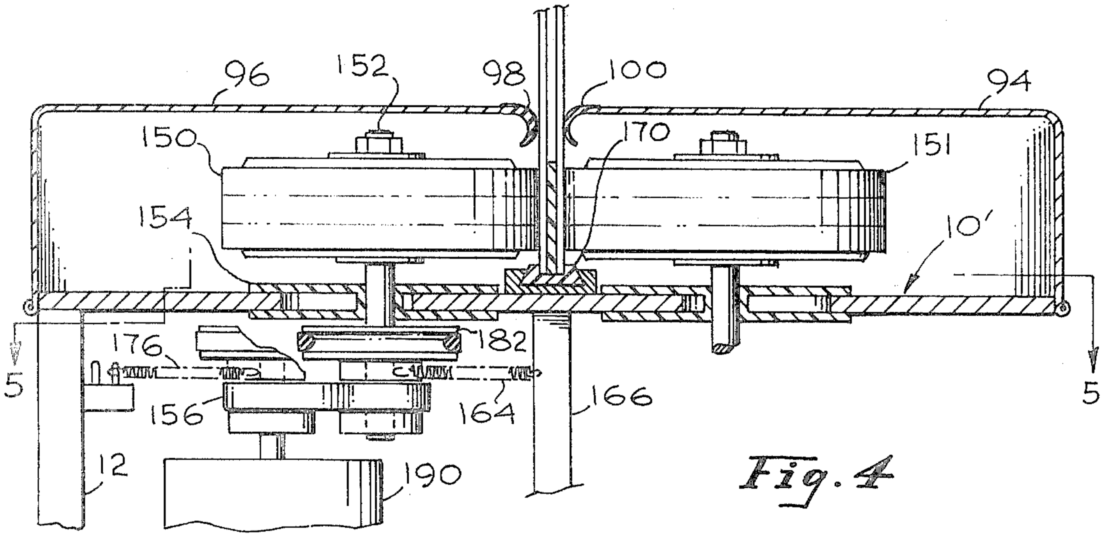
FIG. 4 is a sectional view of an alternative embodiment of the invention.
Figure 5:
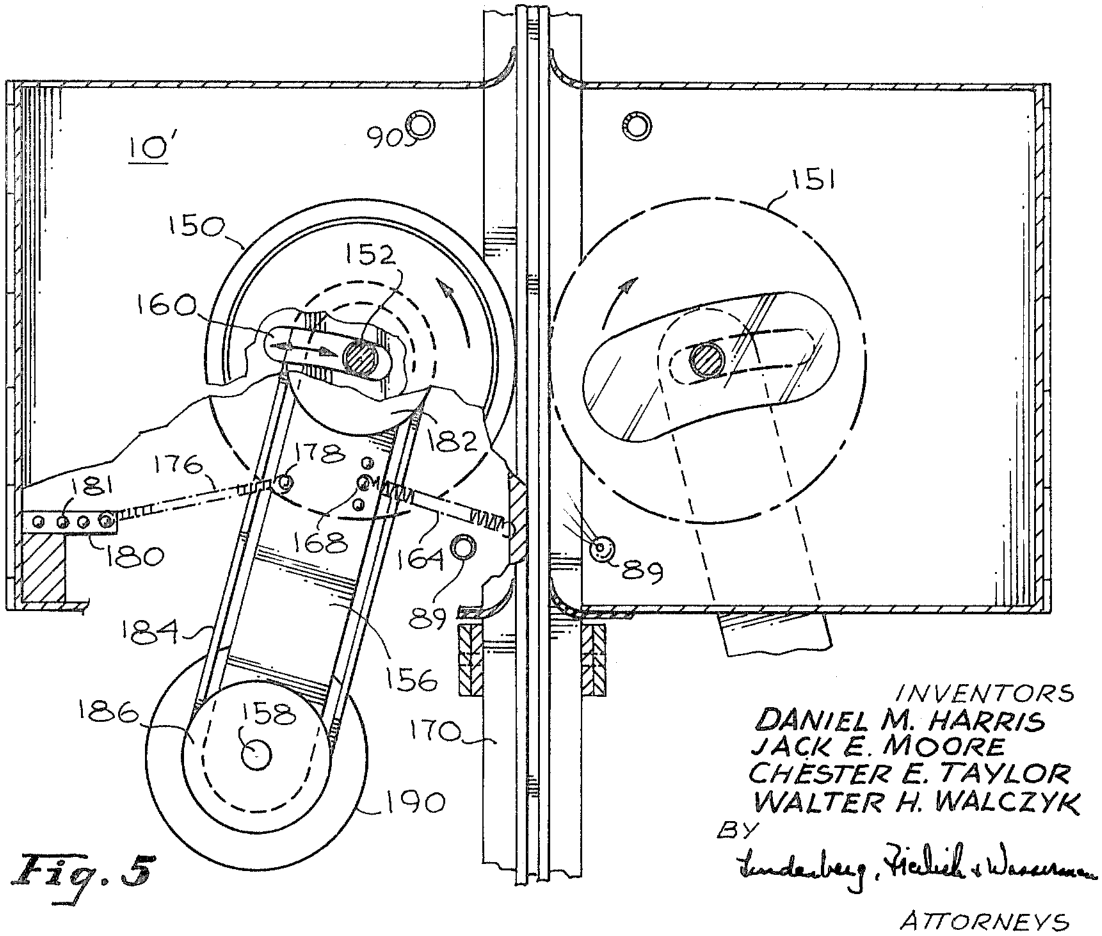
FIG. 5 is a sectional view taken substantially along the plane 5—5 of FIG. 4.

Attention is now called to FIG. 3 which illustrates a schematic diagram of an automated embodiment of the invention in which the scrubbing apparatus of FIGS. 1 and 2, or an alternative embodiment thereof as shown in FIGS. 4 and 5, can be used in automated fashion with printed circuit panels to be scrubbed being moved therethrough by a conveyor system so as to thereby minimize the need for operator intervention to handle each panel in the scrubbing operation. In accordance with the system of FIG. 3, the channel member, previously shown in FIG. 2, is formed in the outer surface of a flexible endless conveyor belt 110 engaged respectively with drive pulley 112 and idler pulley 114. Drive pulley 112 is driven by drive motor 116 via belt 118. The bottom edges of the printed circuit panels to be scrubbed are received within the channel defined in the outer surface of the conveyor belt 110. The top edges 122 of the panels are engaged by soft rubber rollers 124 mounted on the ends of spring-urged spindles 126. The spindles 126 are movable into and out of the body of sleeve member 130 carried by guide track 132.

In the utilization of the conveyor system of FIG. 3, the lower edge of a circuit panel to be scrubbed is placed within the channel formed in the outer surface of the conveyor belt 110. The upper edge of the circuit panel is engaged by the rollers 124 rotatively mounted on spindles 126 carried by sleeves 130. Movement of the conveyor belt 110 will thereby carry the circuit panel along a straight line path between the pair of oppositely rotating brushes mounted, as has been discussed in conjunction with FIGS. 1 and 2 or as will be discussed in conjunction with FIGS. 4 and 5.

Attention is now called to FIGS. 4 and 5 which illustrate an alternative embodiment of the invention in which the position of the brushes is not manually adjustable as in the embodiment of FIGS. 1 and 2, but rather is determined by a spring urging the brushes into contact with the circuit panels. More particularly, in accordance with the embodiment of FIGS. 4 and 5, the cylindrical brush 150 is mounted on a spindle 152 journaled for rotation within a bearing 154 carried by a lever arm 156. The lever arm 156 is pivotable about a fixed pivot point 158. The spindle 152 extends through a slot 160 in a baseplate 101. A spring 164 is terminally fixed between a structural member 166 secured to the underside of the baseplate and selectable retention pins 168 provided on the lever arm 156. Thus, as is best shown in FIG. 5, the spring 164 tends to pivot the lever arm 156 about the pivot point 158 in a clockwise direction to thus move the brush 150 toward the circuit panel path defined by a guide and support means 170. In order to enable the user to easily adjust the pressure between the brush 150 and a circuit panel, a quick-adjust spring 176 is provided which is secured on one end to pin 178 on lever arm 156 and on the other end to a plate 180 having a plurality of pins 181.

In order to drive the spindle 152, a pulley 182 is fixed thereto. The pulley 182 is coupled by a drive belt 184 to a drive pulley 186 driven by motor 190. It is pointed out that the brush 151 in FIGS. 4 and 5 is mounted in the same manner as brush 150.

Except for the differences mentioned, the embodiment of FIGS. 4 and 5 can be substantially the same as the embodiment of FIGS. 1 and 2. Thus, the embodiment of FIGS. 4 and 5 could utilize the same brush construction as was discussed in connection with FIG. 2. Further, a source of waterflow to maintain the periphery of the brushes wet should also be incorporated in the embodiment of FIGS. 4 and 5. Also, the hinged cover portions of FIG. 2 could be advantageously employed in the embodiment of FIGS. 4 and 5.

Although all of the embodiments disclosed herein provide for the brushes to rotate in a horizontal plane about vertical spindles, it is pointed out that the brushes could be mounted for rotation in a vertical plane about horizontally oriented spindles to enable the circuit panels to be horizontally transported therepast.

The embodiments of the invention in which an exclusive property or privilege is claimed are defined as follows:

1. An apparatus useful for scrubbing the surface of a printed circuit panel, said apparatus comprising:
   - a baseplate;
   - guide means on said baseplate for guiding a circuit panel extending substantially perpendicular to said baseplate along a straight line path lying parallel to said baseplate;
   - first and second substantially cylindrical scrub brushes;
   - first means mounting said first brush for rotation about an axis extending perpendicular to said baseplate and positioned to a first side of said straight line path;
   - said first mounting means including a spindle secured to said first brush and journaled for rotation in a first arcuate slot provided in said baseplate and movable therealong;
   - said first mounting means also including a second plate mounted for movement parallel to said baseplate and having an opening therein through which said spindle extends;
   - said first mounting means further including a post secured to said second plate and extending through a second arcuate slot provided in said baseplate equally spaced along the length thereof from said first slot so as to thereby enable said second plate to be moved for adjusting the spacing between the periphery of said first brush and said path;
   - second means mounting said second brush for rotation about an axis extending perpendicular to said baseplate and positioned to a second side of said straight line path; and
   - drive means for rotating said first and second brushes.

2. The apparatus of claim 1 wherein said guide means comprises a channel having a dimension slightly larger than the thickness of said panel whereby an edge of said panel can be fitted in and moved along said channel.

3. The apparatus of claim 1 wherein said guide means includes a spacer projecting vertically from said baseplate along said straight line path.

4. The apparatus of claim 1 wherein said drive means includes an air motor and
   belt means coupling said motor to one of said brushes.

5. The apparatus of claim 1 including means for continually wetting the surface of said brushes.

6. The apparatus of claim 1 including a housing enclosing said brushes and said guide means,
   said housing defining a slot therein in alignment with said straight line path.

7. The apparatus of claim 1 wherein said second mounting means includes means for adjusting the spacing between the periphery of said second brush and said path.

8. The apparatus of claim 1 including spring means urging said first and second brushes toward said path.

* * * * *